United States Patent
Reilly

(10) Patent No.: US 11,824,505 B2
(45) Date of Patent: Nov. 21, 2023

(54) PARAMETRIC AMPLIFIER HAVING A QUANTUM CAPACITANCE DEVICE

(71) Applicant: Microsoft Technology Licensing, LLC, Redmond, WA (US)

(72) Inventor: David J. Reilly, Sydney (AU)

(73) Assignee: Microsoft Technology Licensing, LLC, Redmond, WA (US)

( * ) Notice: Subject to any disclaimer, the term of this patent is extended or adjusted under 35 U.S.C. 154(b) by 442 days.

(21) Appl. No.: 17/114,863

(22) Filed: Dec. 8, 2020

(65) Prior Publication Data
US 2022/0182027 A1     Jun. 9, 2022

(51) Int. Cl.
*G06N 10/00* (2022.01)
*H03F 7/04* (2006.01)

(52) U.S. Cl.
CPC .............. *H03F 7/04* (2013.01); *G06N 10/00* (2019.01)

(58) Field of Classification Search
CPC .................................. H03F 7/04; G06N 10/00
See application file for complete search history.

(56) References Cited

U.S. PATENT DOCUMENTS

| | | | | |
|---|---|---|---|---|
| 2018/0054165 A1* | 2/2018 | Szöcs | ...................... | H10N 60/12 |
| 2018/0150761 A1* | 5/2018 | Sarpeshkar | .............. | G06N 7/01 |
| 2018/0232653 A1* | 8/2018 | Selvanayagam | ........ | H01P 5/028 |
| 2021/0135643 A1* | 5/2021 | House | ....................... | H03F 7/04 |

OTHER PUBLICATIONS

Slichter, Daniel Huber, "Quantum Jumps and Measurement Backaction in a Superconducting Qubit", In Dissertation Submitted in Partial Satisfaction of the Requirements for the degree of Doctor of Philosophy in Physics, University of California, 2011, 216 Pages.
Liu, Chenxu, et al., "Optimizing Josephson-Ring-Modulator-based Josephson Parametric Amplifiers via full Hamiltonian control," In Thesis Submitted to Department of Physics and Astronomy, University of Pittsburgh and Pittsburgh Quantum Institute, May 18, 2020, 24 Pages.
Robertson, William Joseph, "Parametric Amplifier Design," In a Thesis Presented in Partial Fulfillment of the Requirements for the degree of Master of Science in the Graduate School of the Ohio State Univeristy, 1959, 46 Pages, downloaded from "https://etd.ohiolink.edu/apexprod/rws_etd/send_file/send?accession=osu1400145234&disposition=inline" on Oct. 22, 2020.

(Continued)

*Primary Examiner* — Patricia T Nguyen
(74) *Attorney, Agent, or Firm* — Ranjeev Singh; Singh Law, PLLC

(57) ABSTRACT

Systems and methods related to a parametric amplifier including a quantum capacitor are described. In one example, a parametric amplifier comprising an input terminal for receiving a qubit signal is provided. The parametric amplifier further includes a pump terminal for receiving a pump signal. The parametric amplifier further comprises an amplifier, including a plurality of quantum capacitance devices configured to operate in a cryogenic environment, configured to amplify the qubit signal by mixing the qubit signal with the pump signal to generate an amplified signal. The parametric amplifier further includes an output terminal for providing the amplified signal.

20 Claims, 10 Drawing Sheets

(56) References Cited

OTHER PUBLICATIONS

Khorasani, Sina, "CUBIT: Capacitive quantum BIT", In Journal of Carbon Research, vol. 4, Issue 3, Jul. 2, 2018, 9 Pages.
Khorasani, et al., "Nonlinear Graphene Quantum Capacitors for Electro-Optics", In Journal of NPJ 2D Materials and Applications, May 18, 2017, pp. 1-7.
"International Search Report and Written Opinion Issued in PCT Application No. PCT/US21/058883", dated Feb. 3, 2022, 11 Pages.
Saeed, et al., "Exploiting Graphene Quantum Capacitance in Subharmonic Parametric Downconversion", In Proceedings of the IEEE MTT-S International Microwave Symposium (IMS), Jun. 2, 2019, pp. 1111-1114.
Luryi, Serge, "Quantum Capacitance Devices", In Journal of Applied Physics Letters, vol. 52, Issue 6, Feb. 3, 1988, pp. 501-503.

* cited by examiner

700

PARAMETRIC AMPLIFIER HAVING A QUANTUM CAPACITANCE DEVICE

BACKGROUND

In computing and communication systems, the performance of the receiver system used to process quantum information, such as qubits, is important. This is because the poor performance of the receiver system can impact the remaining processing stages in the quantum computing systems or the quantum communication systems. The receiver systems may include amplifiers, whose performance in terms of the noise and the readout fidelity can significantly impact the performance of the receiver systems.

SUMMARY

In one aspect, the present disclosure relates to a system including a plurality of qubit devices configured to operate in a cryogenic environment, where each of the plurality of qubit devices is configured to provide a signal corresponding to at least one qubit. The system may further include a parametric amplifier comprising a quantum capacitor including at least one quantum capacitance device, where the parametric amplifier is configured to amplify a signal corresponding to at least one qubit received from at least one of the plurality of qubit devices.

In another aspect, the present disclosure relates to a method including receiving a signal corresponding to at least one qubit. The method may further include receiving a pump signal. The method may further include using a parametric amplifier, comprising at least one quantum capacitance device, amplifying the signal corresponding to the at least one qubit by mixing the signal corresponding to the at least one qubit with the pump signal.

In yet another aspect, the present disclosure relates to a parametric amplifier comprising an input terminal for receiving a qubit signal. The parametric amplifier may further include a pump terminal for receiving a pump signal. The parametric amplifier may further comprise an amplifier, including a plurality of quantum capacitance devices configured to operate in a cryogenic environment, configured to amplify the qubit signal by mixing the qubit signal with the pump signal to generate an amplified signal. The parametric amplifier may further include an output terminal for providing the amplified signal.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

BRIEF DESCRIPTION OF THE DRAWINGS

The present disclosure is illustrated by way of example and is not limited by the accompanying figures, in which like references indicate similar elements. Elements in the figures are illustrated for simplicity and clarity and have not necessarily been drawn to scale.

DETAILED DESCRIPTION

Figure 1:
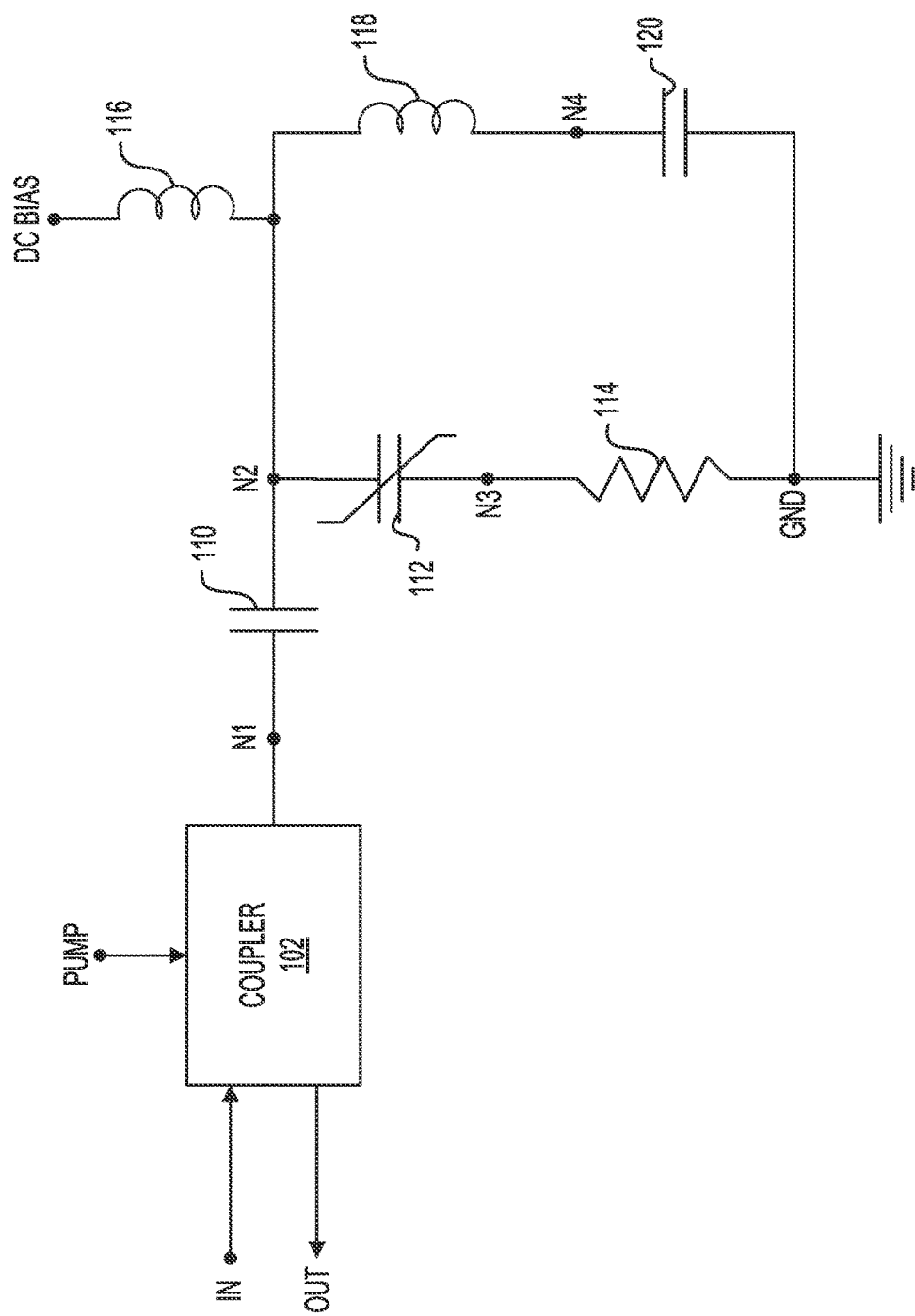
FIG. 1 shows a parametric amplifier in accordance with one example.

Examples disclosed in the present disclosure relate to a parametric amplifier including a quantum capacitor. Certain examples also relate to systems for processing quantum information (e.g., qubits) including receiver systems with at least one parametric amplifier having a quantum capacitor. One of the key requirements for realizing a quantum computer is the ability to detect the state of the quantum information, e.g., a qubit with the highest possible fidelity. For qubit platforms constructed from topological qubits (based on Majorana zero modes), electron spins, or superconducting degrees of freedom, readout may be performed by mapping the state of a qubit into a frequency (phase) or amplitude change of a microwave L-C resonator. Probing and detecting the response of the resonator reveals then the state of the qubit.

Quantum computing systems (operating approximately at 4.2 Kelvin or below) may include receiver systems for processing quantum information, such as qubits. The readout fidelity of the receiver systems may be determined by the signal-to-noise ratio of the receiver systems. The receiver systems may include amplifiers, such as Josephson parametric amplifiers (JPAs) or traveling wave parametric amplifiers (TWPAs). Both approaches have limitations, in particular with respect to scalability and suitability for semiconductor qubits. As an example, while such amplifiers may perform well in a narrow dynamic range of the input power, as the input power rises the signal to noise ratio of such amplifiers degrades. This in turn diminishes the readout fidelity of receiver systems that may be used to process qubits.

Certain examples of the present disclosure seek to address some of the limitations associated with the previously developed receiver systems. In one example, an ultra-low noise cryogenic amplifier based on the voltage controllable quantum capacitance of a semiconductor is described. In certain examples, the quantum capacitance device is embedded in an L-C resonator circuit and pumped with a tone at twice the input frequency. In one example, the quantum capacitor is implemented based on a high-mobility 2-dimensional electron gas (2DEG). Alternatively, the quantum capacitor may be implemented as a two-dimensional hole gas (2DHG)

structure, a field-effect transistor (FET), a fin-FET, a nanowire, or a semiconductor device having carriers that can be modulated using a gate associated with the semiconductor device.

Although the primary application of the ultra-low noise cryogenic amplifier concerns the readout of qubits in a quantum computer, this amplifier may be used as part of receiver systems included in radio astronomy, communications and satellite receiver systems, Wi-Fi systems, radar systems, and other tele-communications (e.g., 5G or 6G cellular systems) and defense applications. The receiver systems may include readout associated with a single qubit or multiple qubits. Readout of multiple qubits simultaneously may require processing multiple channels. As one increases the number of channels being processed (e.g., frequency multiplexing) and an amplifier is used to process signals having multiple frequencies, or multiple channels, using multiple detectors, then the sum of the power of all of the channels may result in the amplifier operating in the saturation region. Moreover, even in receiver systems for qubits, once the number of qubits being processed increases, then saturation may become an issue.

Qubits may be implemented using topological computing gates that may operate at approximately 20 milli-Kelvin (~20 mK). A qubit may be implemented using various physical systems, including photons, electrons, Josephson junctions, quantum dots, or heterostructures. The quantum state(s) may be encoded as a direction of spin, another aspect of spin, charge, energy, or excitation stages as part of a qubit, or a topological phase of superconducting matter. The example qubits may operate based on either low-frequency DC signals (e.g., bias currents) or high-frequency radio frequency signals (e.g., 10 GHz signals), or based on a combination of both. In certain examples, microwave signals may be used to control the superconducting devices, including, for example, the state of the quantum bits (qubits). Certain implementations of the gates for quantum bits (qubits) may require high-frequency microwave signals. In addition, in one example, the qubits may be configured to operate in a cryogenic environment (e.g., in a vacuum and at a temperature from a few milli-Kelvins to 4.2 Kelvin). In one example, a vacuum may relate to a pressure in a range of $10^{-4}$ Torr to $10^{-10}$ Torr. It is to be recognized that the temperature ranges referred to herein relate to the temperature of the environment in which the qubits are operating and not the temperature of the qubits themselves. Thus, references such as "operating at" or "maintained at" refer to the temperature of the environment in which these components are operating or are being maintained inside a housing.

FIG. 1 shows a parametric amplifier 100 in accordance with one example. Parametric amplifier 100 may include an input terminal (IN) for receiving an input signal corresponding to qubits or other forms of quantum information to be amplified. Parametric amplifier 100 may further include an output terminal (OUT) for providing an amplified signal. Parametric amplifier 100 may further include a pump terminal (PUMP) for receiving a pump tone signal. The pump tone signal may provide the power used to amplify the input signal. A coupler 102 may be used to couple each of these signals to node N1. Depending on whether the amplifier circuit is set up in a reflection mode or a different mode, coupler 102 may provide the appropriate directional coupling of the three signals to node N1. Thus, in a reflection mode, the forward and the reverse moving signals may share a single port; alternatively, the forward and the reverse moving signals may be separated from each other. Parametric amplifier 100 may further include a capacitor 110 coupled between the node N1 and a node N2. In one example, capacitor 110 may have a capacitance of 1.4 pico-Farad (pF).

With continued reference to FIG. 1, parametric amplifier 100 may further include a quantum capacitor 112 coupled between the node N2 and a node N4. Quantum capacitor 112 is configured as a variable capacitor. The capacitance of quantum capacitor 112 may be proportional to the voltage across the capacitor. In one example physical implementation, and the other plate of quantum capacitor 112 may be a gate on the surface of a gallium arsenide heterostructure, the bottom plate may be the electron gas (e.g., a two-dimensional electron gas (2DEG) structure described later) itself. When a voltage is applied between the two plates, it depletes the electrons and shrinks the bottom plate, thereby changing the capacitance with the voltage. Quantum capacitor 112 also has an inductance and thus it acts as an oscillator that swings back and forth as the current charges up the capacitor. The charging up of the capacitor generates a voltage that then collapses and the current then generates a magnetic field in the inductor, and thus a magnetic field is exchanged with an electric field, back and forth at the resonant frequency of the circuit. Thus, the input signal and the pump signal are subjected to frequency mixing by quantum capacitor 112, which introduces nonlinearity, because of the sinusoidal oscillating capacitance across its two terminals. The frequency mixing includes multiplication of the two signals resulting in a signal that includes frequencies that are sum and the difference of the original frequencies.

Parametric amplifier 100 may further include a resistor 114 coupled between the ground terminal (GND) and the node N4. In this example, resistor 114 may have a resistance of 1 Ohm. Parametric amplifier 100 may further include an inductor 116 coupled between the node N2 and a DC bias terminal (DC BIAS). In this example, inductor 116 may have an inductance of 1000 nano-Henry (nH). DC voltage may be supplied via the DC bias terminal to bias the gate electrode associate with quantum capacitor 112 with a small DC component. This may allow one to deplete the two dimensional electron gas (2DEG) (described later) by putting a DC voltage on the gate electrode, and then adding an oscillating component that leads to an oscillating capacitance. The size of inductor 116 may be selected to ensure that the AC signals are blocked and yet the DC voltage is allowed to pass to the gate electrode associated with quantum capacitor 112.

Still referring to FIG. 1, parametric amplifier 100 may further include an inductor 118 coupled between the node N2 and a node N4. In this example, inductor 118 may have an inductance of 22 nH. Parametric amplifier 100 may further include a capacitor 120 coupled between the node N4 and the ground terminal (GND). In this example, capacitor 120 may have a capacitance of 300 pF. Although FIG. 1 shows a certain number of components of parametric amplifier 100, it may further include additional or fewer components arranged differently. As an example, although not shown in FIG. 1, a third frequency signal (idler signal) may also be coupled to parametric amplifier 100. In this example, parametric amplifier 100 may act as a two tank amplifier having two resonant circuits: (1) the signal tank and the (2) the idler tank, which may be connected via quantum capacitor 112.

In terms of the theory associated with the operation of parametric amplifier 100, as an example, assuming the current in the nonlinear reactor is represented by $i_{nl}$ and the capacitance of quantum capacitor 112 is $C_{nl}$, then the current in the nonlinear reactor may be represented as:

$$i_{nl} = \frac{d}{dt}(C_{nl}v_t) = \frac{C_c d(v_t^2)}{dt},$$

where $C_c$ is the capacitance across capacitor 110. The tank voltage may be formed based on the frequency of three signals (source, idler, and pump, respectively) and may be represented by the equation: $v_t = V_1 \sin(\omega_s t + \phi_1) + V_2 \sin(\omega_i t + \phi_1) + V_3 \sin(\omega_p t + \phi_1)$, where $\omega_s$ is the frequency of the source signal, $\omega_i$ is the frequency of the idler signal, and $\omega_p$ is the frequency of the pump signal. If the reactor's current at the source signal's frequency ($\omega_s$) is transformed into the phase domain, then it may be represented by the equation: $I_{nl}(\omega_s) = jC_c V_3 V_2 \omega_s e^{j(\phi_3 - \phi_2 - \phi_1)}$. This example assumes that the pump frequency is double the tank resonance frequency ($\omega_t$) and thus $$\omega_t = \frac{1}{\sqrt{LC}} = \frac{1}{2}\omega_p.$$

At the center frequency ($\omega_s \approx \omega_t \approx \omega_i$), the admittance of the nonlinear reactor can be represented as $$Y_{nl} = -G_{nl} = -\frac{\omega_t^2 C_3}{G_L},$$

where $C_3$ is the tank's passive admittance and $G_L$ is the loaded loss of the circuit including the tank and the loss coupled to it by the load. A negative value for $G_{nl}$ may indicate that the nonlinear reactor including the quantum capacitance device reflects power back towards the input.

In case $G_L - G_{nl} \approx 0$, significant gain may be provided by the amplifier and oscillations may be observed at $G_L - G_{nl} = 0$. At the degeneracy point, the gain may be phase-dependent.

In this example, assuming a matched amplifier, the power gain based on the frequency may be represented as:

$$G_p = \left| -1 + \frac{G_L}{Y_s + Y_{nl}} \right|^2,$$

where $Y_s$ is the tank's admittance at the source frequency. Expressing the source and idler frequencies with a detuning $\omega_s$: $\omega_s = \omega_t - \omega_x$, $\omega_i = \omega_t + \omega_x$, $\omega_p = 2\omega_t$, the reactor's equivalent admittance as a function of frequency may be represented as:

$$Y_{nl} = -\frac{\omega_t^2 C_3}{G_L} \frac{1 + j2Q_t \frac{\omega_x}{\omega_t}}{1 + \left(2Q_t \frac{\omega_x}{\omega_t}\right)^2} = -G_{nl} \frac{1 + jx}{1 + x^2}, x = 2Q_t \frac{\omega_x}{\omega_t},$$

where $Q_t$ is the loaded quality factor of the amplifier's tank. The gain versus frequency may be represented as:

$$G_p = \frac{G_{nl}^2 + x^2 [G_{nl} + G_L(1 + x^2)]^2}{[-G_{nl} + G_L(1 + x^2)]^2 + x^2 [G_{nl} + G_L(1 + x^2)]^2}.$$

Approximating $(1 + x^2) \approx 1$, and assigning $$G_m = \frac{G_{nl}^2}{(G_L - G_{nl})^2} \text{ and } c = \frac{G_{nl} + G_L^2}{(G_L - G_{nl})^2},$$

the gain may then be rewritten as:

$$G_p = \frac{G_m + cx^2}{1 + cx^2}.$$

The bandwidth may be expressed as:

$$BW = \frac{2f_t}{2Q_t} \sqrt{\frac{G_m}{c(G_m - 2)}}.$$

The gain-bandwidth relationship may be expressed as:

$$\sqrt{G_m} \times BW = \frac{f_t}{2Q_t} \frac{2G_m}{c(G_m - 2)}.$$

In this example, the factor $$\frac{2G_m}{c(G_m - 2)} \lesssim 1$$

may be close to unity because for high gain levels $c \approx 4G_m$. Therefore, in this example, the gain-bandwidth relationship may follow a linear profile for even high gain levels.

Figure 2:
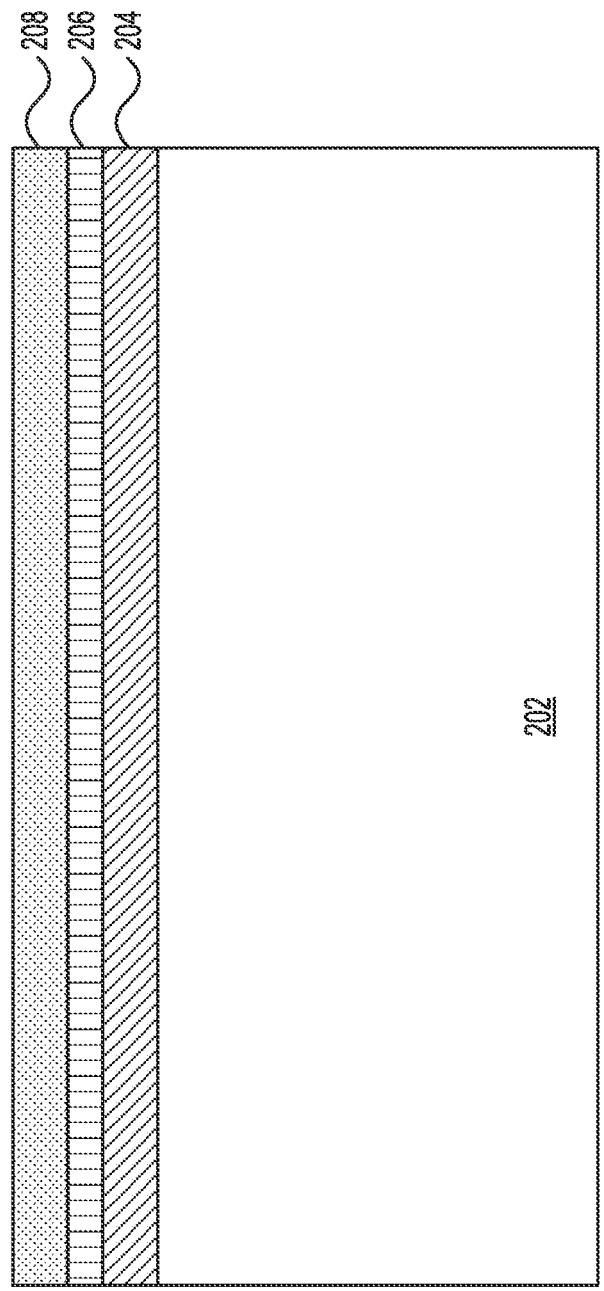
FIG. 2 shows a cross-section view of an example quantum capacitance device during at least one step used to form the quantum capacitance device.

FIG. 2 shows a cross-section view of at least one step used in forming a quantum capacitance device 200 in accordance with one example. In one example, one or more quantum capacitance devices 200 may be used to implement quantum capacitor 112 of FIG. 1. As an example, several instances of quantum capacitance device 200 may be arranged in parallel to form quantum capacitor 112. In this example, as part of this step, starting with a substrate 202, a buffer layer 204 may be formed. Next, a quantum well layer 206 may be formed on top of buffer layer 204. Next, another buffer layer 208 may be formed on top of quantum well layer 206 to complete the formation of the heterostructure corresponding to one or more superconducting quantum wells. Buffer layer 208 may not be necessary to complete the formation of certain types of quantum wells. In this example, substrate 202 may be a gallium arsenide (GaAs) substrate. Instead of gallium arsenide, indium phosphide (InP) may also be used to form the substrate. Buffer layer 204 may be an indium gallium arsenide (InGaAs) layer. Quantum well layer 206 may be an indium arsenide (InAs) layer. Buffer layer 208 may be an indium aluminum arsenide (InAlAs) layer. Each of these layers may be formed using molecular-beam epitaxy (MBE). As an example, the MBE related process may be performed in an MBE system that allows atomic layer deposition of the appropriate materials in a vacuum. Although FIG. 2 shows a certain number of layers of quantum capacitance device 200 arranged in a certain manner, there could be more, or fewer numbers of layers arranged differently. As an example, any of indium phosphide (InP), indium arsenide (InAs), indium antimonide (InSb), mercury cadmium telluride (HgCdTe), or any appropriate combination of materials selected from groups II, III, IV, V, and VI of the periodic table, or any ternary compounds of three different atoms of materials selected from groups II, III, IV, V, and VI of the periodic table may be used.

Figure 3:
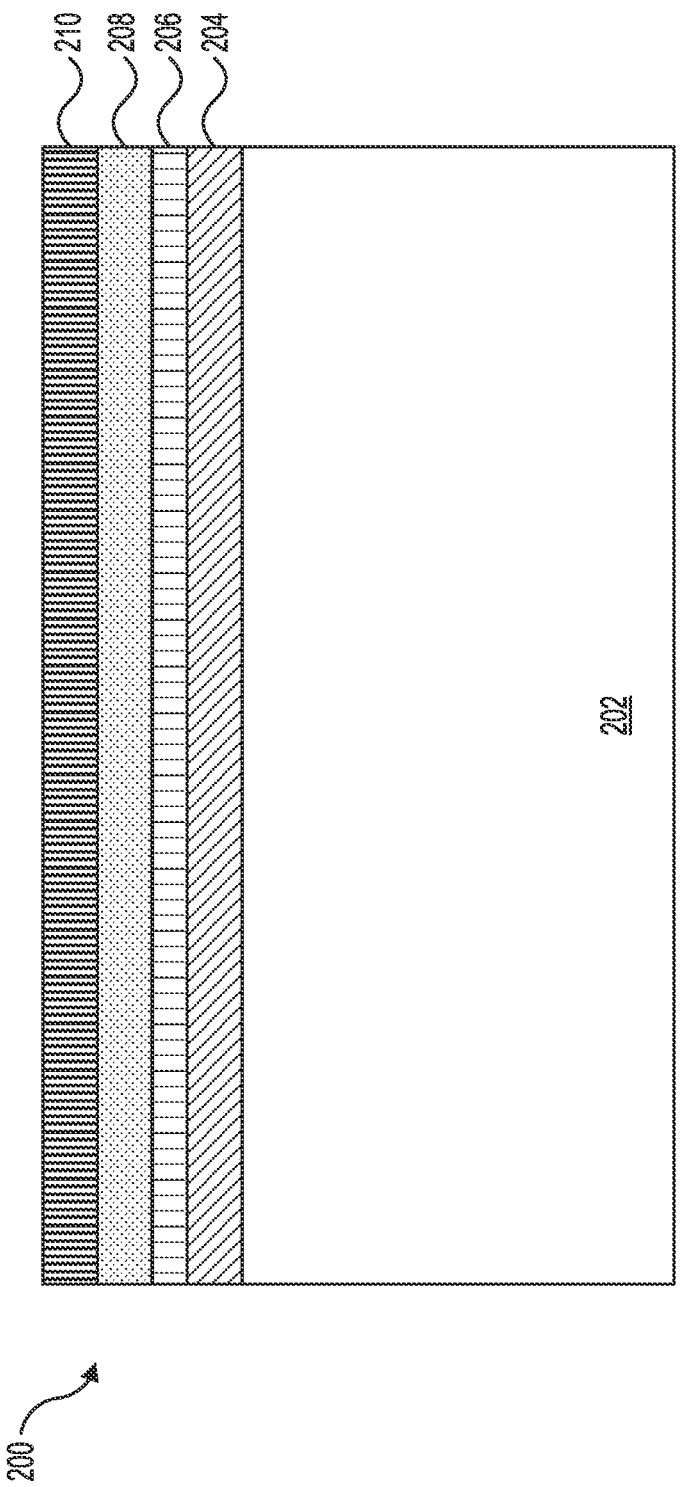
FIG. 3 shows a cross-section view of an example quantum capacitance device during at least one step used to form the quantum capacitance device.

FIG. 3 shows a cross-section view of at least one step used in forming a quantum capacitance device 200 in accordance with one example. As part of this step, a metal layer 210 may be formed on top of buffer layer 208. In this example, metal layer 210 may be deposited using MBE. Metal layer 210 may be comprised of aluminum, niobium, or any other metal that may be superconducting at certain temperatures. Although FIG. 3 shows a certain number of layers of quantum capacitance device 200 arranged in a certain manner, there could be more, or fewer numbers of layers arranged differently.

Figure 4:
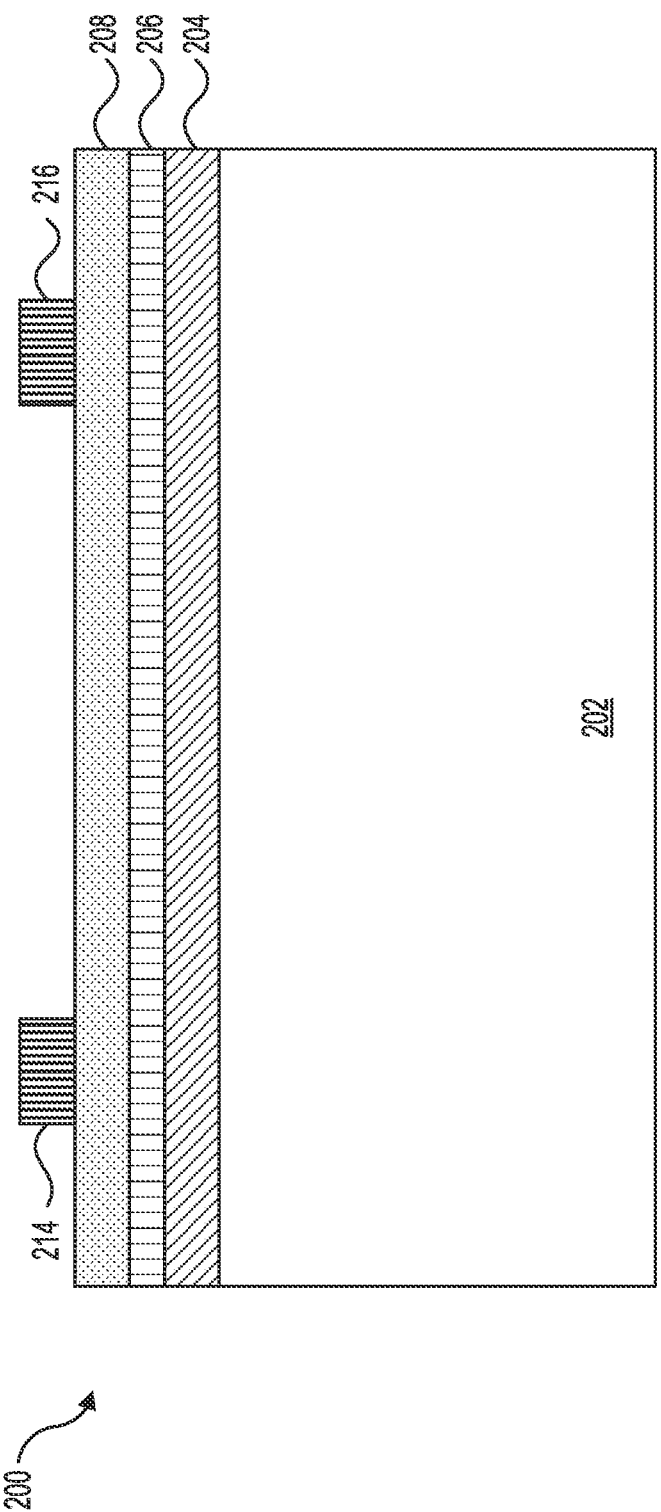
FIG. 4 shows a cross-section view of an example quantum capacitance device during at least one step used to form the quantum capacitance device.

FIG. 4 shows a cross-section view of at least one step used in forming a quantum capacitance device 200 in accordance with one example. As part of this step, using semiconductor processing techniques, including patterning of photoresist, portions of metal layer 210 may be selectively removed to form contacts 214 and 216. Moreover, as part of this step, the wafer containing quantum capacitance device 200 may be annealed by heating the wafer to a predefined temperature for a specified time and then cooling the wafer temperature in a specified manner. In addition, other portions from where metal layer 210 has been removed may be used to form topologically active areas of the quantum capacitance device. This step may be performed using a wet etch or a dry etch. The active areas may include quantum wells, e.g., GaAs quantum wells or InAs quantum wells. The quantum wells may be formed at a shallow depth (e.g., approximately within 10 nm of the surface). Although FIG. 4 shows a certain number of layers of quantum capacitance device 200 arranged in a certain manner, there could be more, or fewer numbers of layers arranged differently.

Figure 5:
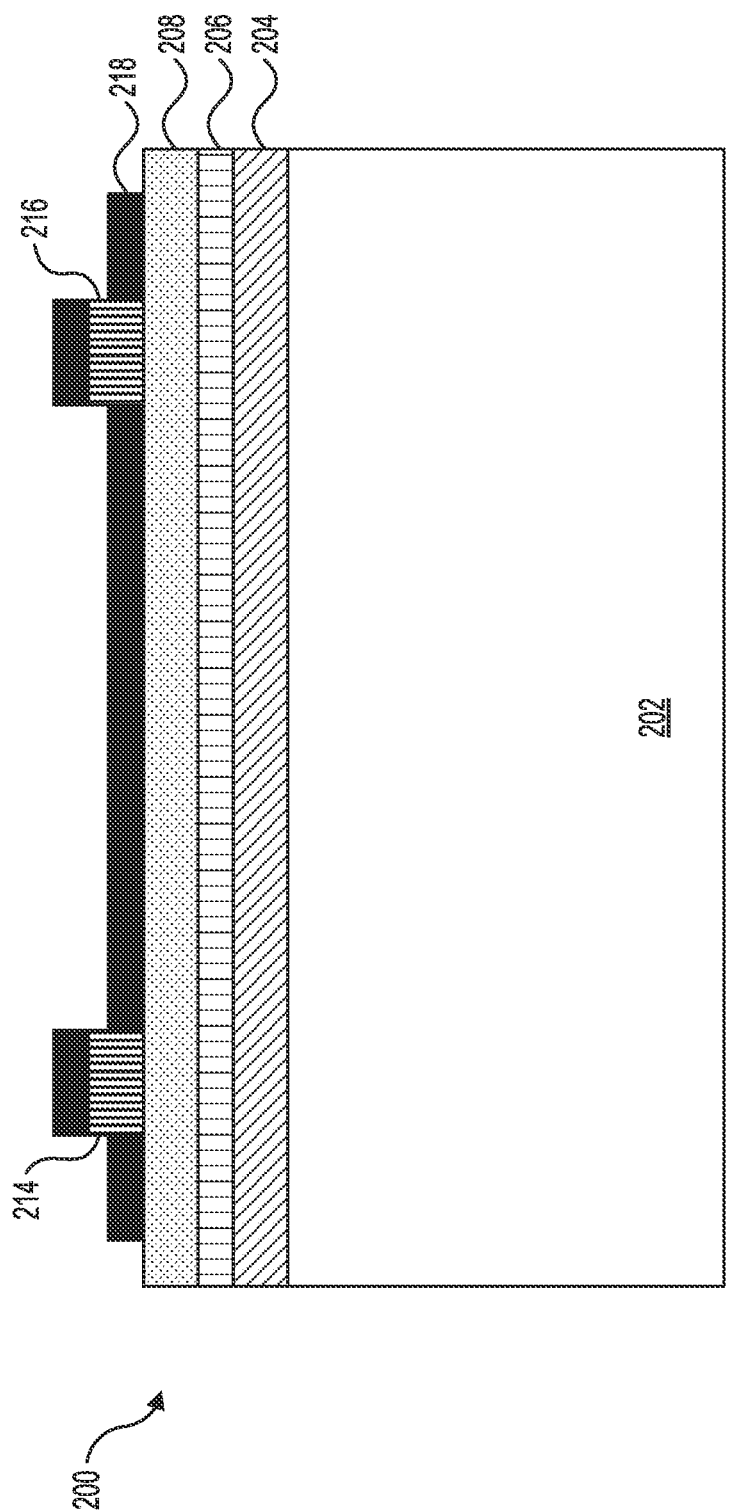
FIG. 5 shows a cross-section view of an example quantum capacitance device during at least one step used to form the quantum capacitance device.

FIG. 5 shows a cross-section view of at least one step used in forming a quantum capacitance device 200 in accordance with one example. As part of this step a dielectric layer 218 may be formed. In this example, dielectric layer 218 is formed using atomic layer deposition. Dielectric layer 218 may be comprised of aluminum oxide (e.g., $Al_2O_3$). The formation of dielectric layer 218 may create a two-dimensional electron gas (2DEG) structure. The 2DEG structure may include trapped electrons with mobility in only two dimensions. As an example, the trapped electrons may not move in a vertical direction. Instead of the 2DEG structure, a two-dimensional hole gas (2DHG) structure may also be formed if materials such as graphene are used. Although FIG. 5 shows a certain number of layers of quantum capacitance device 200 arranged in a certain manner, there could be more, or fewer numbers of layers arranged differently.

Figure 6:
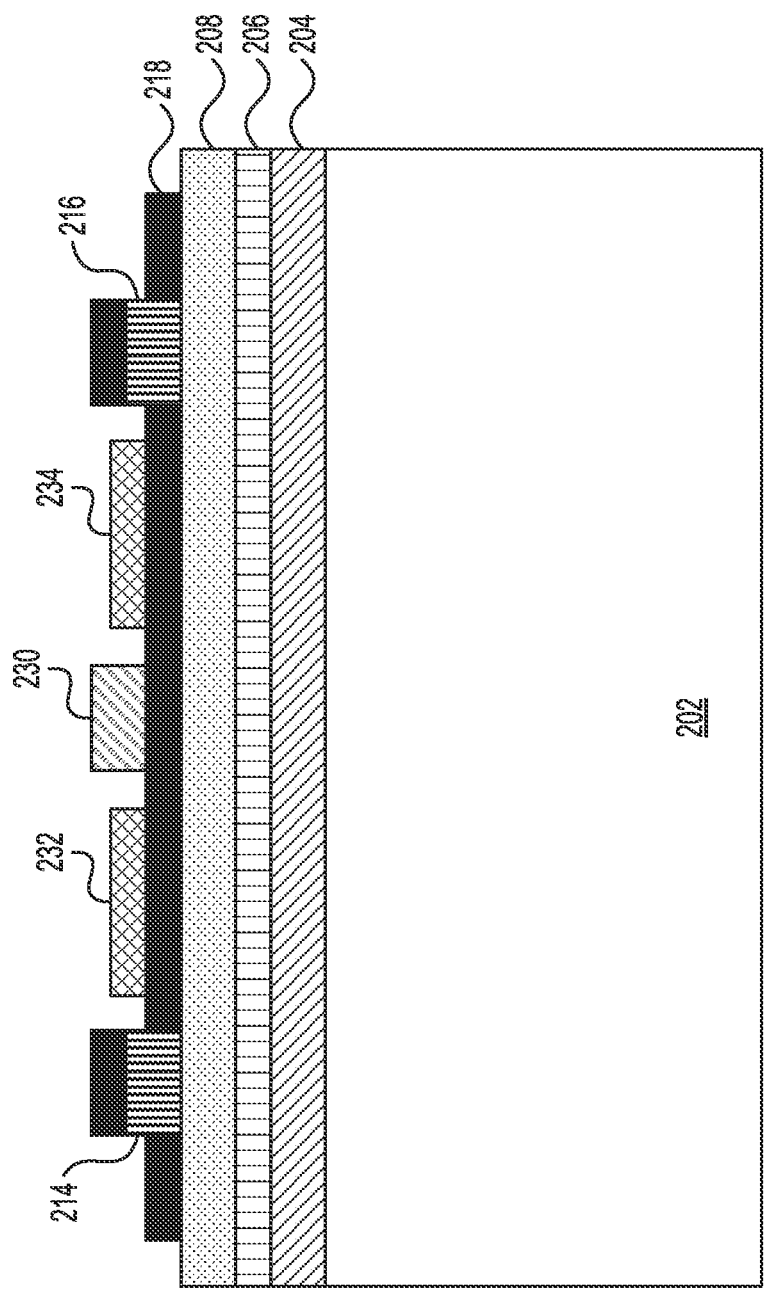
FIG. 6 shows a cross-section view of an example quantum capacitance device during at least one step used to form the quantum capacitance device.

FIG. 6 shows a cross-section view of at least one step used in forming a quantum capacitance device 200 in accordance with one example. This step includes forming a gate 230 (e.g., a metal gate) for controlling the capacitance of quantum capacitance device 200. In one example, gate 230 may be a niobium-titanium-nitride (NbTiN) stack. The capacitance of quantum capacitance device 200 is proportional to the voltage across the capacitor, and its physical implementation is one plate of the capacitor (tied to gate 230 on the surface of heterostructure) and the other plate is the 2DEG itself. Thus, if a voltage is applied using these two plates, then the electrons may be depleted, resulting in shrinkage of the bottom plate, and thereby changing the capacitance based on the applied voltage. In addition, as part of this step, or at a later stage, ground contacts to the ground terminal may be formed (e.g., ground contacts 232 and 234).

Although FIG. 6 shows a certain number of layers of quantum capacitance device 200 arranged in a certain manner, there could be more, or fewer numbers of layers arranged differently. In addition, although FIGS. 2-6 describe the formation of a 2DEG as a quantum capacitance device, using similar steps and techniques, other structures, including a two-dimensional hole gas (2DHG) structure, a field-effect transistor (FET), a fin-FET, a nanowire, or a semiconductor device having carriers that can be modulated using a gate associated with the semiconductor device may be formed to function as the quantum capacitance device.

Figure 7:
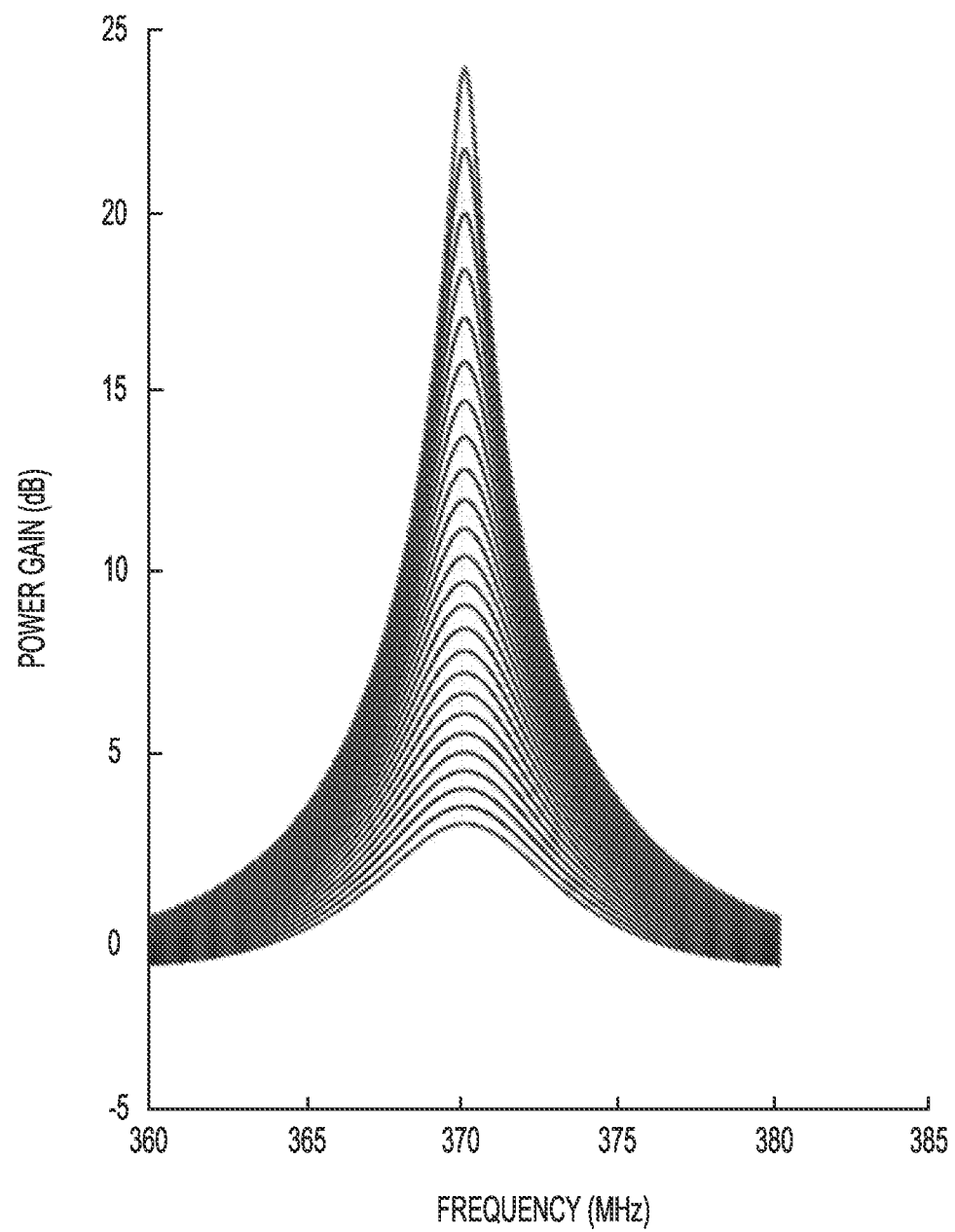
FIG. 7 shows a graph indicating a relationship between the power and the frequency of a parametric amplifier in accordance with one example.

FIG. 7 shows a graph 700 indicating a relationship between the power and the frequency of a parametric amplifier in accordance with one example. While graph 700 shows the highest gain (represented by POWER GAIN in the vertical axis) at a certain frequency (shown along the horizontal axis), a particular parametric amplifier may be configured such that the highest gain is at a different frequency.

Figure 8:
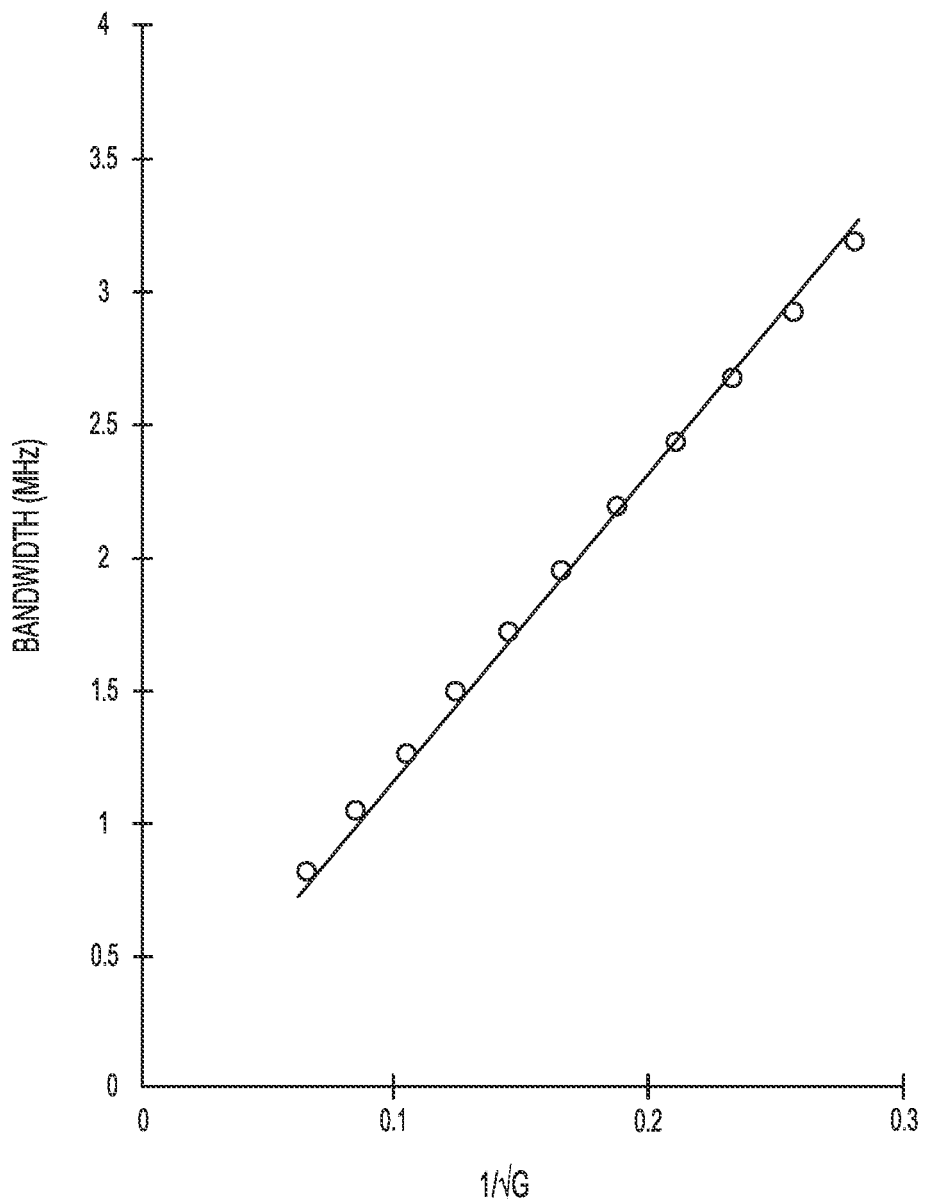
FIG. 8 shows a graph indicating a relationship between the power and the frequency of a parametric amplifier in accordance with one example.

FIG. 8 shows a graph 800 indicating a relationship between the power and the frequency of a parametric amplifier in accordance with one example. Graph 800 shows that the gain-bandwidth relationship for the example parametric amplifier described in the present disclosure may be linear even for high gain levels.

Figure 9:
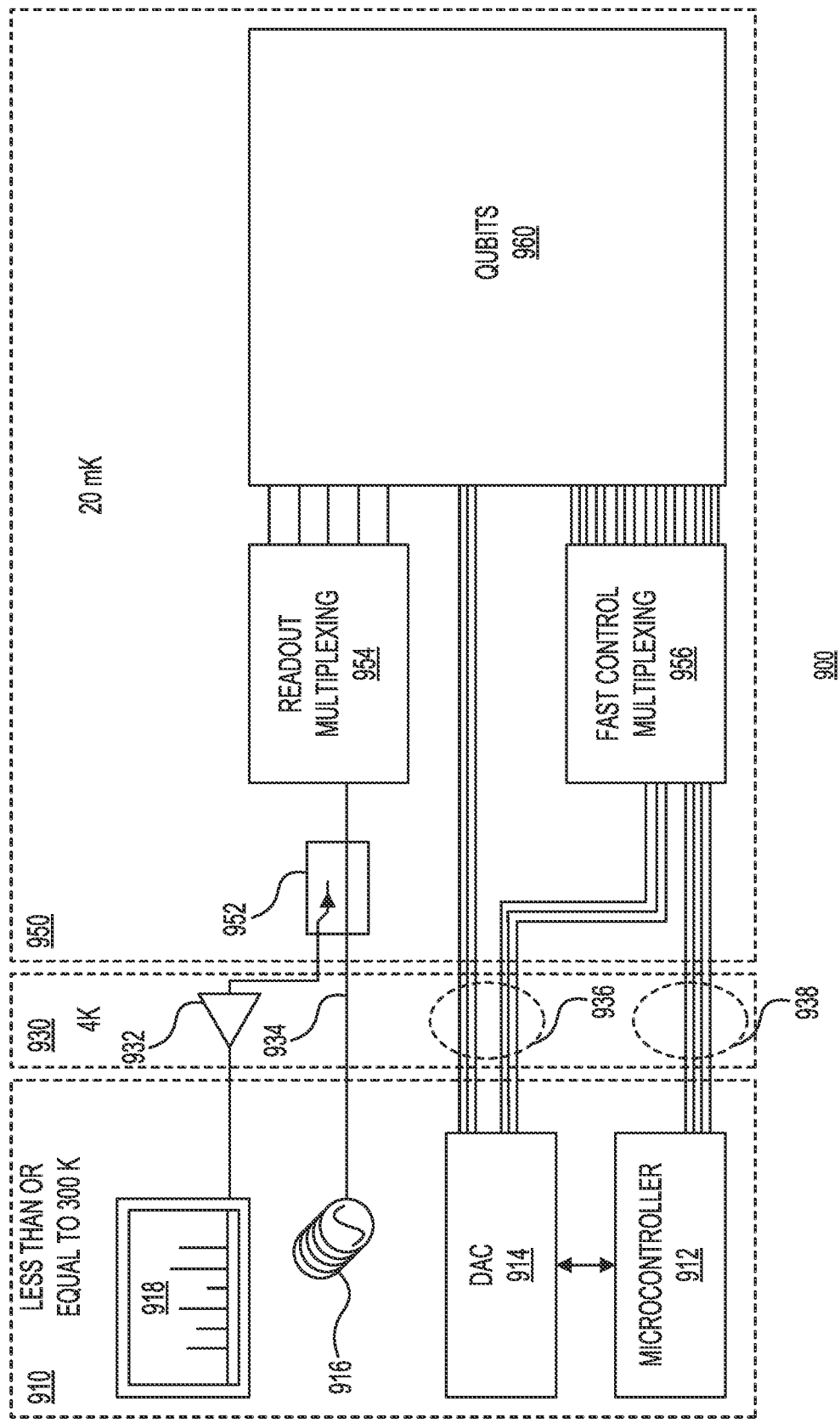
FIG. 9 shows a system including a parametric amplifier of FIG. 1 in accordance with one example.

FIG. 9 shows a system 900 including a parametric amplifier 932 in accordance with one example. In this example, parametric amplifier 932 may be implemented in a similar manner as described earlier. System 900 may include multiple stages, each of which may be configured to operate at a different temperature. Thus, system 900 may include stages 910, 930, and 950. Stage 910 may include components configured to operate in an environment with a temperature less than or equal to 300 Kelvin. Stage 930 may include components configured to operate in an environment with a temperature at or around 4 Kelvin. Stage 950 may include components configured to operate in an environment with a temperature at or around 20 milli-Kelvin (mK). Stage 910 may include a microcontroller 912 (or a microprocessor), a digital-to-analog converter (DAC) 914, signal generators 916, and measurement devices 918. Microcontroller 912 may generate control signals configured to control qubits and other aspects of system 900. DAC 914 may receive digital control signals from microcontroller 912 (or from other components) and convert those into an analog form. The analog signals may then be transmitted to the other stages, as needed. Signal generators 916 may include microwave signal generators and other clock signal generators, as needed. Measurement devices 918 may include instrumentation, such as spectrum analyzers. In one example, each of microcontroller 912 (or a microprocessor), a digital-to-analog converter (DAC) 914, signal generators 916, and measurement devices 918 may include devices described earlier allowing for lowering power consumed by such components.

With continued reference to FIG. 9, stage 930 may include components configured to interconnect stage 910 with stage 950 in a manner that reduces thermal load and allows efficient connectivity between the components at room temperature and the components at 20 milli-Kelvin (mK). Thus, in this example, stage 930 may include parametric amplifier 932, interconnect 934, interconnect 936, and interconnect 938. Interconnects 934, 936, and 938 may be implemented as cables comprising conductors, such as niobium and copper. The conductors may be insulated within the interconnects using appropriate dielectric materials, such as polyimide.

Still referring to FIG. 9, stage 950 may include a coupler 952, readout multiplexing 954, fast control multiplexing 956, and qubits 960. Coupler 952 may couple signals from the signal generators (e.g., signal generators 916) to readout multiplexing 954. Coupler 952 may also direct any reflected signals to parametric signal 932. Parametric amplifier 932 may be configured to amplify the qubit signals received from coupler 952. Readout multiplexing 954 and fast control multiplexing 956 may be implemented on a single control chip (sometimes referred to as the cryogenic-control CMOS chip). In one example, readout multiplexing 954 may be implemented using superconducting materials, such as niobium on an inert substrate, such as sapphire. Readout multiplexing 954 chip may contain multiple inductive, capacitive, and resistive elements of suitable sizes to form bank(s) of resonators. At cryogenic temperatures, resonator circuits exhibit superconductivity and produce a resonator with high quality factors. This may provide an efficient low loss frequency multiplexing mechanism. In one example, the cryogenic-CMOS control chip (e.g., an ASIC manufactured using a semiconductor technology, such as CMOS) may be mounted on the same substrate as the qubits (e.g., qubits 960) and may be configured to operate at the same temperature as the qubits (e.g., 20 mK). Although FIG. 9 certain components included as part of system 900, it may include additional or fewer components arranged differently. As an example, parametric amplifier 932 may be integrated with coupler 952 and may be configured to operate at the same temperature as the qubits 960.

Figure 10:
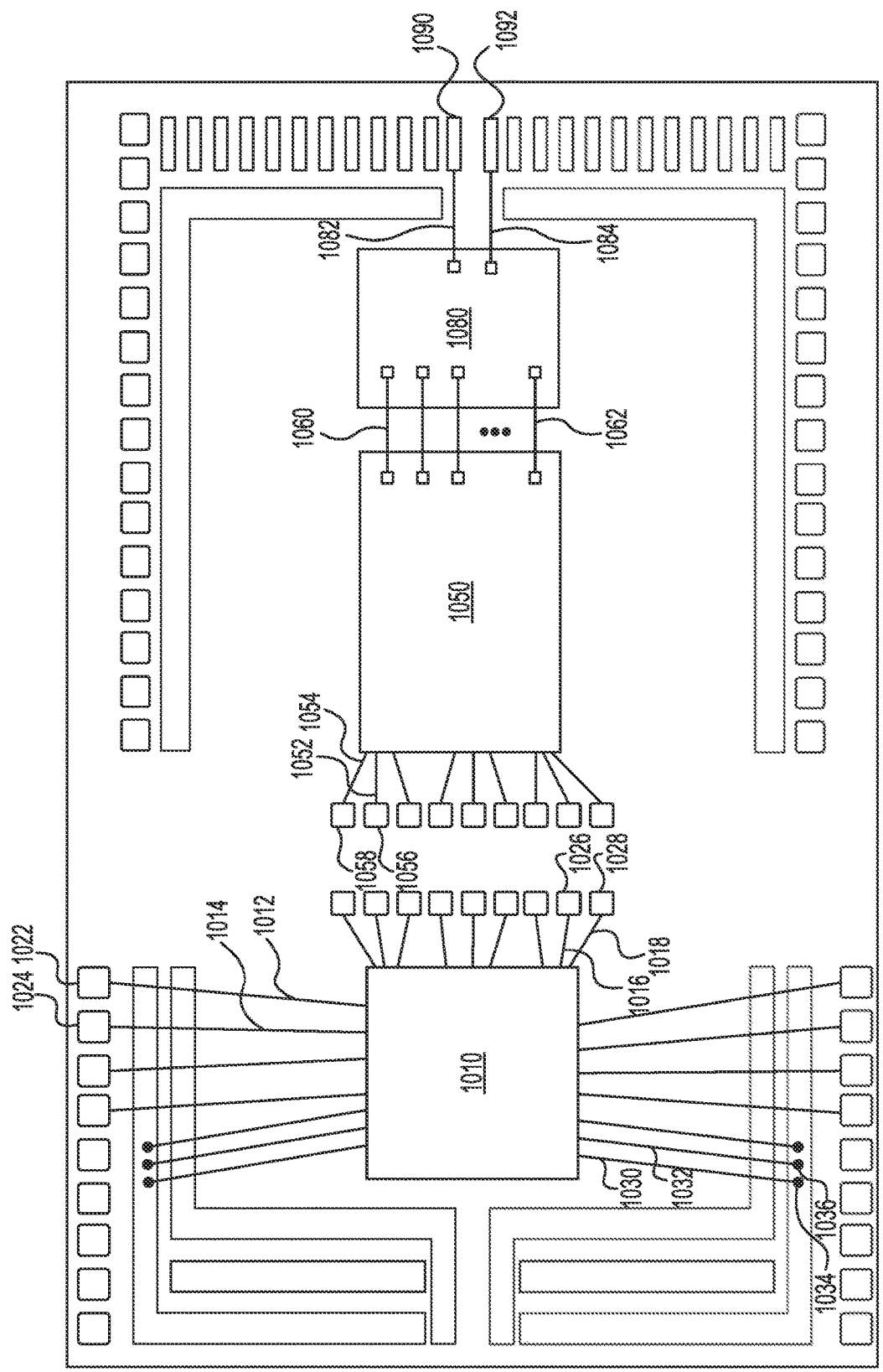
FIG. 10 shows a common substrate including a control chip, a qubit chip, and a resonator chip in accordance with one example.

FIG. 10 shows a common substrate 1000 including a cryogenic-CMOS control chip 1010, a qubit chip 1050, and a resonator chip 1080 in accordance with one example. Cryogenic-CMOS control chip 1010 may be coupled to contact pads (e.g., contact pads 1022 and 1024) via wire bonds (e.g., wire bonds 1012 and 1014). Cryogenic-CMOS control chip 1010 may further be coupled to contact pads (e.g., contact pads 1026 and 1028) via wire bonds (e.g., wire bonds 1016 and 1018). Cryogenic-CMOS control chip 1010 may further be coupled to other contacts (e.g., contacts 1034 and 1036) via wire bonds (e.g., wire bonds 1030 and 1032). Qubit chip 1050 may be coupled to contact pads (e.g., contact pads 1056 and 1058) via wire bonds (e.g., wire bonds 1052 and 1054). Qubit chip 1050 may be coupled to resonator chip 1080 via wire bonds (e.g., wire bonds 1060 and 1062). Resonator chip 1080 may be coupled to contacts (e.g., contacts 1090 and 1092) via wire bonds (e.g., wire bonds 1082 and 1084). In this example, as part of the readout path, resonator chip 1080 may include parametric amplifier 932, coupler 952, and readout multiplexing 954. In this manner, parametric amplifier 932 may be tightly integrated with the rest of the system. Although this example shows the tight integration between the resonator chip and the qubits via wire bonding, other techniques may also be used. As an example, the resonator chip may be flip-chip bonded to the substrate with the qubits. Alternatively, package-on-package, system-in-package, or other multi-chip assemblies may also be used.

Although the above description refers to quantum devices, the systems described herein can be implemented to support any service or application that can be offered via a combination of computing, networking, and storage resources, such as via a data center or other infrastructure for delivering a service or an application. The described aspects can also be implemented in cloud computing environments. Cloud computing may refer to a model for enabling on-demand network access to a shared pool of configurable computing resources. For example, cloud computing can be employed in the marketplace to offer ubiquitous and convenient on-demand access to the shared pool of configurable computing resources. A cloud computing model can be composed of various characteristics such as, for example, on-demand self-service, broad network access, resource pooling, rapid elasticity, measured service, and so forth. A cloud computing model may be used to expose various service models, such as, for example, Hardware as a Service ("HaaS"), Software as a Service ("SaaS"), Platform as a Service ("PaaS"), and Infrastructure as a Service ("IaaS"). A cloud computing model can also be deployed using different deployment models such as private cloud, community cloud, public cloud, hybrid cloud, and so forth.

In conclusion, in one aspect, the present disclosure relates to a system including a plurality of qubit devices configured to operate in a cryogenic environment, where each of the plurality of qubit devices is configured to provide a signal corresponding to at least one qubit. The system may further include a parametric amplifier comprising a quantum capacitor including at least one quantum capacitance device, where the parametric amplifier is configured to amplify a signal corresponding to at least one qubit received from at least one of the plurality of qubit devices.

The quantum capacitance device may comprise a voltage-controllable quantum capacitance device. The quantum capacitance device may comprise at least one of a two-dimensional electron gas (2DEG) structure, a field-effect transistor (FET), a fin-FET, a nanowire, or a semiconductor device having carriers that can be modulated using a gate associated with the semiconductor device.

The parametric amplifier may further comprise an input terminal for receiving the signal corresponding to the at least one qubit. The parametric amplifier may further comprise a pump terminal for receiving a pump signal. The parametric amplifier may be configured to amplify the signal corresponding to the at least one qubit by mixing the signal corresponding to the at least one qubit with the pump signal to generate an amplified signal.

The parametric amplifier may also comprise an output terminal for providing the amplified signal, and the parametric amplifier may comprise a coupler for coupling the input terminal with the pump terminal and the output terminal. The cryogenic environment may correspond to a temperature below 4.2 Kelvin and a pressure in a range between $10^{-3}$ Torr to $10^{-10}$ Torr.

In another aspect, the present disclosure relates to a method including receiving a signal corresponding to at least one qubit. The method may further include receiving a pump signal. The method may further include using a parametric amplifier, comprising at least one quantum capacitance device, amplifying the signal corresponding to the at least one qubit by mixing the signal corresponding to the at least one qubit with the pump signal.

The quantum capacitance device may comprise a voltage-controllable quantum capacitance device. The quantum capacitance device may comprise at least one of a two-dimensional electron gas (2DEG) structure, a two-dimensional hole gas (2DHG) structure, a field-effect transistor (FET), a fin-FET, a nanowire, or a semiconductor device having carriers that can be modulated using a gate associated with the semiconductor device. A frequency associated with the pump signal may be two-times of a resonant frequency associated with an LC tank comprising the at least one quantum capacitance device. The cryogenic environment may correspond to a temperature below 4.2 Kelvin and a pressure in a range between $10^{-3}$ Torr to $10^{-10}$ Torr.

The method may further include controlling a voltage of the voltage-controlled quantum capacitance device by shrinking a size of electron gas formed as part of at least one two-dimensional electron gas (2DEG) structure.

In yet another aspect, the present disclosure relates to a parametric amplifier comprising an input terminal for receiving a qubit signal. The parametric amplifier may further include a pump terminal for receiving a pump signal. The parametric amplifier may further comprise an amplifier, including a plurality of quantum capacitance devices configured to operate in a cryogenic environment, configured to amplify the qubit signal by mixing the qubit signal with the pump signal to generate an amplified signal. The parametric amplifier may further include an output terminal for providing the amplified signal.

Each of the each of the plurality of quantum capacitance devices may comprise a semiconductor heterostructure including gallium arsenide. Each of the plurality of quantum capacitance devices may comprise a voltage-controllable quantum capacitance device.

The voltage-controllable quantum capacitance device may comprise at least one of a two-dimensional electron gas (2DEG) structure, a two-dimensional hole gas (2DHG) structure, a field-effect transistor (FET), a fin-FET, a nanowire, or a semiconductor device having carriers that can be modulated using a gate associated with the semiconductor device. The cryogenic environment may correspond to a temperature below 4.2 Kelvin and a pressure in a range between $10^{-3}$ Torr to $10^{-10}$ Torr.

It is to be understood that the methods, modules, and components depicted herein are merely exemplary. For example, and without limitation, illustrative types of superconducting devices may include Field-Programmable Gate Arrays (FPGAs), Application-Specific Integrated Circuits (ASICs), Application-Specific Standard Products (ASSPs), System-on-a-Chip systems (SOCs), Complex Programmable Logic Devices (CPLDs), etc.

In addition, in an abstract, but still definite sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or inter-medial components. Likewise, any two components so associated can also be viewed as being "operably connected," or "coupled," to each other to achieve the desired functionality.

Furthermore, those skilled in the art will recognize that boundaries between the functionality of the above-described operations are merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

Although the disclosure provides specific examples, various modifications and changes can be made without departing from the scope of the disclosure as set forth in the claims below. Accordingly, the specification and figures are to be regarded in an illustrative rather than a restrictive sense, and all such modifications are intended to be included within the scope of the present disclosure. Any benefits, advantages, or solutions to problems that are described herein with regard to a specific example are not intended to be construed as a critical, required, or essential feature or element of any or all the claims.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed:

1. A system comprising:
a plurality of qubit devices configured to operate in a cryogenic environment, wherein each of the plurality of qubit devices is configured to provide a signal corresponding to at least one qubit; and
a parametric amplifier comprising a quantum capacitor including at least one quantum capacitance device, wherein the at least one quantum capacitance device comprises a voltage-controllable quantum capacitance device, and wherein the parametric amplifier is configured to amplify a signal corresponding to at least one qubit received from at least one of the plurality of qubit devices.

2. The system of claim 1, wherein the quantum capacitance device comprises at least one of a two-dimensional electron gas (2DEG) structure, a field-effect transistor (FET), a fin-FET, a nanowire, or a semiconductor device having carriers that can be modulated using a gate associated with the semiconductor device.

3. The system of claim 1, wherein the parametric amplifier further comprises an input terminal for receiving the signal corresponding to the at least one qubit.

4. The system of claim 3, wherein the parametric amplifier further comprises a pump terminal for receiving a pump signal.

5. The system of claim 4, wherein the parametric amplifier is configured to amplify the signal corresponding to the at least one qubit by mixing the signal corresponding to the at least one qubit with the pump signal to generate an amplified signal.

6. The system of claim 5, wherein the parametric amplifier comprises an output terminal for providing the amplified signal, and wherein the parametric amplifier comprises a coupler for coupling the input terminal with the pump terminal and the output terminal.

7. The system of claim 1, wherein the cryogenic environment corresponds to a temperature below 4.2 Kelvin and a pressure in a range between $10^{-3}$ Torr to $10^{-10}$ Torr.

8. A method comprising:
receiving a signal corresponding to at least one qubit;
receiving a pump signal; and
using a parametric amplifier, comprising at least one quantum capacitance device, amplifying the signal corresponding to the at least one qubit by mixing the signal corresponding to the at least one qubit with the pump signal, wherein the at least one quantum capacitance device is a voltage-controllable quantum capacitance device.

9. The method of claim 8, wherein the quantum capacitance device comprises a two-dimensional electron gas (2DEG) structure.

10. The method of claim 8, wherein the quantum capacitance device comprises at least one of a two-dimensional hole gas (2DHG) structure, a field-effect transistor (FET), a fin-FET, a nanowire, or a semiconductor device having carriers that can be modulated using a gate associated with the semiconductor device.

11. The method of claim 8, further comprising controlling a voltage of the voltage-controlled quantum capacitance device by shrinking a size of electron gas formed as part of at least one two-dimensional electron gas (2DEG) structure.

12. The method of claim 8, wherein a frequency associated with the pump signal is two-times of a resonant frequency associated with an LC tank comprising the at least one quantum capacitance device.

13. The method of claim 8, wherein the at least one qubit is configured to operate in a cryogenic environment, and wherein the cryogenic environment corresponds to a temperature below 4.2 Kelvin and a pressure in a range between $10^{-3}$ Torr to $10^{-10}$ Torr.

14. A parametric amplifier comprising:
an input terminal for receiving a qubit signal;
a pump terminal for receiving a pump signal;
an amplifier, including a plurality of quantum capacitance devices configured to operate in a cryogenic environment, configured to amplify the qubit signal by mixing the qubit signal with the pump signal to generate an amplified signal, wherein each of the plurality of quantum capacitance devices comprises a voltage-controllable quantum capacitance device; and
an output terminal for providing the amplified signal.

15. The system of claim 14, wherein the each of the plurality of quantum capacitance devices comprises a semiconductor heterostructure including gallium arsenide.

16. The system of claim 15, wherein the voltage-controllable quantum capacitance device comprises at least one of a two-dimensional electron gas (2DEG) structure, a two-dimensional hole gas (2DHG) structure, a field-effect transistor (FET), a fin-FET, a nanowire, or a semiconductor device having carriers that can be modulated using a gate associated with the semiconductor device.

17. The system of 14, wherein the cryogenic environment corresponds to a temperature below 4.2 Kelvin and a pressure in a range between $10^{-3}$ Torr to $10^{-10}$ Torr.

18. The system of claim 4, wherein a frequency associated with the pump signal is two-times of a resonant frequency associated with an LC tank comprising the at least one quantum capacitance device.

19. The system of claim 1, wherein the quantum capacitor is configured as a variable capacitor.

20. The system of claim 19, wherein a capacitance of the variable capacitor is proportional to a voltage across the variable capacitor.

* * * * *